US009627062B2

(12) United States Patent
Pickering

(10) Patent No.: US 9,627,062 B2
(45) Date of Patent: Apr. 18, 2017

(54) SRAM CELLS

(71) Applicant: SURECORE LIMITED, Leeds (GB)

(72) Inventor: Andrew Pickering, Rugby (GB)

(73) Assignee: SURECORE LIMITED, Leeds (GB)

( * ) Notice: Subject to any disclaimer, the term of this patent is extended or adjusted under 35 U.S.C. 154(b) by 75 days.

(21) Appl. No.: 14/767,442

(22) PCT Filed: Feb. 6, 2014

(86) PCT No.: PCT/GB2014/050334
§ 371 (c)(1),
(2) Date: Aug. 12, 2015

(87) PCT Pub. No.: WO2014/125254
PCT Pub. Date: Aug. 21, 2014

(65) Prior Publication Data
US 2015/0371708 A1    Dec. 24, 2015

Related U.S. Application Data

(60) Provisional application No. 61/765,885, filed on Feb. 18, 2013.

(30) Foreign Application Priority Data

Feb. 13, 2013    (GB) .................................. 1302524.2
Oct. 15, 2013    (GB) .................................. 1318262.1

(51) Int. Cl.
*G11C 11/419*    (2006.01)
*G11C 14/00*    (2006.01)
(Continued)

(52) U.S. Cl.
CPC ............ *G11C 14/0063* (2013.01); *G11C 8/14* (2013.01); *G11C 11/404* (2013.01);
(Continued)

(58) Field of Classification Search
CPC ... G11C 11/404; G11C 11/413; G11C 11/417; G11C 11/419
(Continued)

(56) References Cited

U.S. PATENT DOCUMENTS 5,253,137 A    10/1993    Seevinck
5,475,639 A    12/1995    Iwase et al.
(Continued)

FOREIGN PATENT DOCUMENTS

DE    10133281 A1    1/2002
EP    0801397 A2    10/1997
(Continued)

OTHER PUBLICATIONS

International Search Report and Written Opinion of the International Searching Authority, mailed Apr. 22, 2014, in International Application No. PCT/GB2014/050334, 2 pages (PCT/ISA/220), 5 pages WO.
(Continued)

*Primary Examiner* — Gary Portka
(74) *Attorney, Agent, or Firm* — Meunier Carlin & Curfman LLC

(57) ABSTRACT

There is provided a memory unit that comprises a plurality of memory cell groups, each memory cell group comprising a plurality of memory cells that are each operatively connected to a first local bit line and a second local bit line by respective first and second access transistors, and each memory cell being associated with a word line configured to control the first and second access transistors of the memory cell. The first and second local bit lines of each memory cell group being operatively connected to respective first and second column bit lines by respective first and second group access switches, the first group access switch being configured to be controlled by the second column bit line, and the
(Continued)

second group access switch being configured to be controlled by the first column bit line.

24 Claims, 13 Drawing Sheets

(51) Int. Cl.
*G11C 8/14* (2006.01)
*G11C 11/412* (2006.01)
*G11C 11/418* (2006.01)
*G11C 11/413* (2006.01)
*G11C 11/417* (2006.01)
*G11C 11/404* (2006.01)

(52) U.S. Cl.
CPC .......... *G11C 11/412* (2013.01); *G11C 11/413* (2013.01); *G11C 11/417* (2013.01); *G11C 11/418* (2013.01); *G11C 11/419* (2013.01)

(58) Field of Classification Search
USPC ..... 365/189.08, 189.14, 189.15, 189.16, 231
See application file for complete search history.

(56) References Cited

U.S. PATENT DOCUMENTS

| | | | |
|---|---|---|---|
| 2002/0006072 A1* | 1/2002 | Kunikiyo | G11C 8/16 365/230.05 |
| 2005/0201168 A1 | 9/2005 | Sugahara et al. | |
| 2007/0025140 A1 | 2/2007 | Redwine | |
| 2008/0074916 A1 | 3/2008 | Liaw | |
| 2010/0110773 A1 | 5/2010 | Sachdev et al. | |
| 2012/0014173 A1 | 1/2012 | Deng | |
| 2012/0127782 A1 | 5/2012 | Moriwaki | |
| 2013/0028032 A1 | 1/2013 | Koike et al. | |
| 2015/0121030 A1* | 4/2015 | Lin | G11C 11/419 711/170 |

FOREIGN PATENT DOCUMENTS

| | | |
|---|---|---|
| GB | 2508221 A | 5/2014 |
| JP | H04372793 | 12/1992 |
| JP | 2003007067 A | 1/2003 |

OTHER PUBLICATIONS

Great Britain Intellectual Property Office Combined Search and Examination Report, issued in Great Britain Patent Application No. GB1302524.2, May 28, 2013, 4 pages.

International Preliminary Report on Patentability (Annexes thereto), mailed Apr. 30, 2015, in International Application No. PCT/GB2014/050334, 13 pages.

Response to the Written Opinion of the International Preliminary Examining Authority, dated Apr. 10, 2015, in International Application No. PCT/GB2014/050334, 12 pages.

Great Britain Intellectual Property Office Examination Report, dated Oct. 14, 2014, and issued in Great Britain Patent Application No. GB1302524.2, 3 pages.

Response to the International Search Report and Written Opinion of the International Searching Authority pursuant to PCT Article 31, dated Nov. 25, 2014, in International Application No. PCT/GB2014/050334, 4 pages.

* cited by examiner

Figure 3: (PRIOR ART)

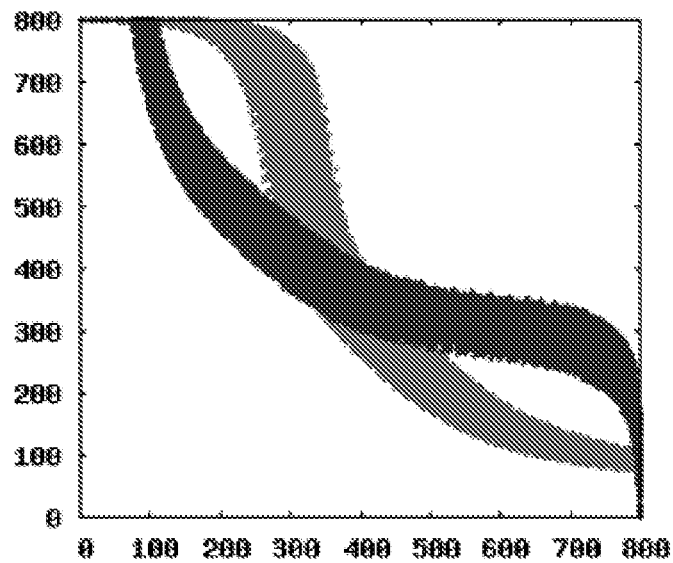
(a) Conventional read operation
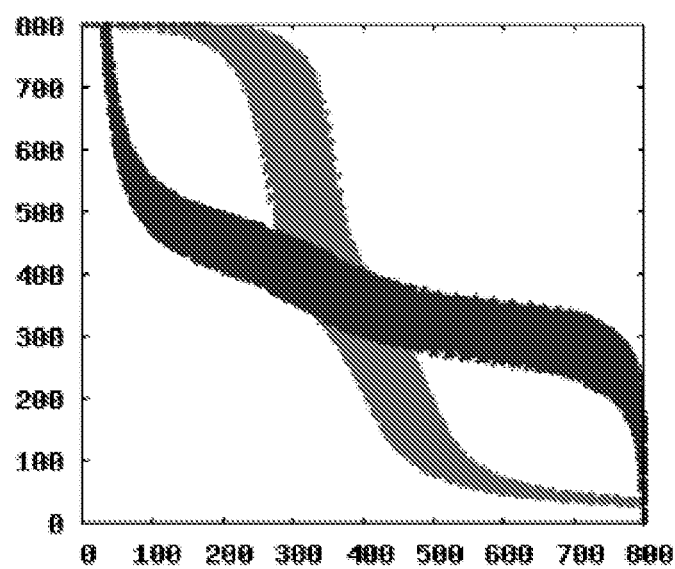
(b) Current-limited read operation
Figure 9

SRAM CELLS

CROSS REFERENCE TO RELATED APPLICATIONS

This application claims the benefit of Great Britain Patent Application No. 1302524.2, filed Feb. 13, 2013, U.S. Provisional Application No. 61/765,885, filed Feb. 18, 2013, and Great Britain Patent Application No. 1318262.1, filed Oct. 15, 2013, each of which is incorporated herein by reference in its entirety.

The present invention relates to SRAM cells and relates particularly to such cells with a reduced power requirement.

Data storage is an essential requirement for virtually all modern digital electronic systems. Static read/write memory (SRAM) comprises a major part of that function, being relatively easy to integrate thus offering fast access and low power. With the advent of deep sub-micron (DSM) geometry silicon processing, the task of implementing reliable SRAM storage whilst simultaneously maintaining low power consumption becomes increasingly problematic, whilst conversely demand rises with the proliferation of battery-powered electronic gadgets requiring progressively larger memories.

The most commonly-used design of memory cell is the 6-transistor circuit shown in FIG. 1 and consists of a storage element made up of two back-to-back inverters ([MN1, MP1] and [MN2, MP2]) with access transistors (MA1 and MA2) which are turned ON by means of a word line control (WL) to form a conducting path between the data storage nodes (N1 and N2) of the cell and the external bit lines (BLA and BLB). Writing to the cell is achieved by forcing a high voltage onto one of BLA or BLB whilst simultaneously forcing a low voltage onto the other, and then driving the word line (VVL) high to activate the access path allowing the voltage levels held on the bit lines (BLA and BLB) to overcome the state of the storage element. The word line is then driven low to disconnect the memory cell with its data store held in its new state. Reading from the cell is achieved by initially driving both bit lines to a notionally high voltage level before then driving the word line (WL) high. One of either BLA or BLB will then be pulled low through the access devices by the low voltage side of the storage cell. The difference in voltage levels between the two bit lines can then be sensed and used to determine the data value.

One crucial part of the design of this cell is the drive strength ratios of the NMOS pull down transistors (MN1 and MN2), the NMOS access devices (MA1 and MA2) and the PMOS pull up devices (MP1 and MP2). In particular, the access devices need to be sufficiently large relative to the pull-up devices to guarantee that the cell state is over-written during a write, but not so large (relative to the pull-down devices) that the cell becomes over-loaded and unstable during a read thereby causing the stored data value to be lost.

The act of reading this cell therefore presents its most challenging operating condition for retaining its data whilst the storage elements are loaded via the access devices (i.e. access devices turned on and both bit lines high). With the inevitable degree of random device variability suffered on DSM technologies due to the very small geometry of the individual devices, simultaneously meeting both writability and read stability criteria on all cells in a very large memory (10's of millions of bits) becomes extremely challenging.

In order to alleviate the difficulty of addressing these conflicting requirements simultaneously, an increasingly common practice is to use an 8-transistor cell design such as that shown in FIG. 2. This effectively separates out the write and read paths of the circuit, by the addition of two extra NMOS devices: one whose gate is driven by one of the storage nodes (MDR) and one which acts as an access device (MAR) to a separate read bit line (RBL) used solely for read operations. Write operations on this 8-transistor cell design are identical to those for the 6-transistor cell. For reads, however, instead of the write word line WWL being driven high, the single read bit line (RBL) is initially pre-charged to a high voltage and then the read word line (RWL) driven high. That enables the data-dependent discharge path from the read bit line (RBL) through the cell to VSS, and so the read bit line (RBL) will either stay high (due to its capacitance) or be pulled low by the cell. The state of the read bit (RBL) line can then be sensed to determine the data value stored in the selected bit.

A block of memory constructed from traditional 6-transistor memory cells is shown in FIG. 3. This block contains an array of M rows by N columns of cells, with the word lines connected horizontally across the array and bit lines running vertically. The orientation of the array is arbitrary (e.g. the array could equally be orientated such that word lines are connected vertically across the array with the bit lines running horizontally); however, by convention the word lines always are said to run along the rows of an array of memory cells whilst the bit lines are always said to run down the columns of an array of memory cells. At the bottom of the array there is a multiplex structure selecting which of the columns is to be accessed (for either read or write) according to a set of column select signals (sel_1, sel_2 etc.) which are derived from the address supplied to the memory. Such a block would be replicated for each bit of the memory input/output data word. Thus N columns are required to store the data for each single bit. The value of the column mux selection ratio N is generally dictated by architectural and layout constraints; with values of 4, 8 or 16 often being favoured. Initially before each memory access, the bit lines for all columns are pre-charged into a high state (circuitry not shown).

For a write operation, the voltage on one or other of the bit lines (according to the required input data value) is driven low just for the required column and then the word line pulsed high for long enough to write the data into that cell. Similarly for a read operation, the word line on the required row is driven high, and this causes all the cells on that row to try to assert their data value onto the bit lines. One of the columns will be enabled by the column select signals to drive its bit line voltages out to the sense amp which detects the voltage difference on the bit lines to determine the memory cell's state.

Although any read or write operation will target only one of the N columns in the memory block at any time, the access devices in the memory cells will be enabled for every column in the active row. This results in N−1 cells all unnecessarily trying to assert their data onto their respective bit lines during those operations. This both represents wasted power and also presents those cells with their data retention challenge state (access devices turned on, bit lines high), rendering the entire row vulnerable to external noise.

Whilst the addition of the read buffering transistors in the standard 8-transistor cell allows more flexibility in optimising performance (e.g. the read devices can be made larger to attain faster reading speed without rendering the cell unwritable), it does nothing to address power wastage in either read or write operation. The read path is still enabled for all columns in the memory block even though only one column is essential, whilst the write path is identical to that of the 6-transistor cell and suffers equivalent inefficiency and vulnerability to noise.

Cell designs have been published which seek to address this power wastage via the addition of a column select signal to activate only the cell being accessed. One such design is illustrated in FIG. 4, in which a standard 6-transistor cell is augmented with two additional transistors in series with the access devices and an extra column select line (CS) for controlling the additional transistors. Such a cell will only be accessed if both WWL and CS are high. Whilst this addresses the wasted power issue, it does nothing to solve the noise vulnerability of the selected cell during a read operation and indeed possibly makes the balancing of device strengths to achieve robust read and write more problematic.

FIG. 5 illustrates a yet further cell design in which the bit lines themselves are used to determine if the cell is actively selected, rather than an additional column select signal. The memory cell of FIG. 5 provides buffered read operations by implementing a data-dependent conduction path between the two bit lines, BLA and BLB, to provide the means to sense the stored data, with the option of gating on the cell write path to provide cell selection during write operations. In this design, rather than the write word line (WWL) coupling the bit lines directly into the cell via the access devices for writing to the cell, it instead enables a pull down path to the low bit line on one side or other of the storage element depending on which of BLA and BLB is high and which is low. To do so, the arrangement of FIG. 5 includes a BLB controlled switch (MAX1) connected between BLA and the first node (NA), and a BLA controlled switch (MAX2) connected between BLB and the second node (NB). One significant departure from traditional operation using this cell is that the default state for all inactive bit lines should be low, thereby turning off the paths through MAX1 and MAX2 and disconnecting all cells on unselected columns.

In the design of FIG. 5 the write and read paths for the cell are separate, the read path being implemented by the data-dependent conduction path between the two bit lines enabled by the read word line (RWL). The arrangement of FIG. 5 has the advantage of saving power during read and write operations when compared with the standard 6-transistor cell. In addition, in providing buffered read operations this arrangement also avoids stability problems. However, these advantages are achieved at the expense of four additional transistors and an additional control signal (RWL). It will therefore be appreciated that it would be desirable to provide an improved arrangement that achieves essentially the same advantages with fewer components.

Therefore, according to a first aspect of the present invention there is provided a memory unit that comprises:
a) a plurality of memory cell groups, each memory cell group comprising a plurality of memory cells that are each operatively connected to a first local bit line and a second local bit line by respective first and second access transistors, and each memory cell being associated with a word line configured to control the first and second access transistors of the memory cell;
b) the first and second local bit lines of each memory cell group being operatively connected to respective first and second column bit lines by respective first and second group access switches, the first group access switch being configured to be controlled by the second column bit line and the second group access switch being configured to be controlled by the first column bit line.

Each memory cell group may preferably comprise an odd number of a plurality memory cells. The memory unit may comprise a first memory cell group that includes three memory cells and an adjacent second memory cell group that includes five memory cells. The memory unit may comprise a plurality of aggregate memory cell groups, wherein each aggregate memory cell group comprises a first memory cell group that includes three memory cells and an adjacent second memory cell group that includes five memory cells. The plurality of memory cell groups may be provided as pairs of adjacent memory cell groups, each pair comprising a first memory cell group that includes three memory cells and a second memory cell group that includes five memory cells Each memory cell may comprise a pair of cross-coupled inverters having respective first and second storage access nodes, the first access transistor being operatively connected to the first storage node, and the second access transistor being operatively connected to the second storage node. The first local bit line may be operatively connected to the first storage node via the first access transistor, and the second local bit line may be operatively connected to the second storage node via the second access transistor.

The word line associated with a memory cell may be connected to a gate on the first access transistor of the memory cell and a gate on the second access transistor of the memory cell.

For each memory cell group, the first group access switch may be connected between the first local bit line and the first column bit line and may be configured to be controlled by second column bit line, and the second group access switch may be connected between the second local bit line and the second column bit line and may be configured to be controlled by first column bit line.

The memory unit may further comprise a sense amplifier connected to a differential input pair, the differential input pair being configured to be controlled by the first column bit line and the second column bit line. The differential input pair may comprise first and second input transistors, the first column bit line being configured to control the first input transistor and the second column bit line being configured to control the second input transistor.

The memory unit may comprise a plurality of columns, each column having a first column bit line and a second column bit line, and each of the plurality of memory cell groups may be disposed within one of the plurality of columns.

Preferably, each memory cell comprises a single word line. For each memory cell group, the first group access switch may comprise a transistor having a gate connected to the second column bit line. For each memory cell group, the second group access switch may comprise a transistor having a gate connected to the first column bit line.

The memory unit may further comprise a controlled current source configured to charge one or both of the first column bit line and the second column bit line. The controlled current source may comprise a current mirror.

The memory unit may further comprise a dummy timing element a dummy timing element configured to provide an indication as to when one of the first column bit line and the second column bit line has been pulled high. The dummy timing element may comprise a capacitance device and a controlled current source configured to apply a charging current to the capacitance device.

The memory unit may further comprise a voltage source configured to charge one or both of the first column bit line and the second column bit line.

There is also provided a memory unit comprising a plurality of memory cells, each memory cell comprising a pair of cross-coupled inverters having respective first and second storage access nodes, a first access transistor operatively connected to the first storage node, a second access transistor operatively connected to the second storage node, and a read and write word line connected to a gate on the first access transistor and a gate on the second access transistor for controlling the first access transistor and the second access transistor. The memory unit also comprises a first bit line operatively connected to the first storage node of each of the plurality of memory cells via the respective first access transistors, and a second bit line operatively connected to the second storage node of each of the plurality of memory cells via the respective second access transistors. The memory unit further comprises a first switch connected in series with the first access transistor of each of the plurality of memory cells, between the first access transistor of each of the plurality of memory cells and the first bit line, and configured to be controlled by the second bit line, and a second switch connected in series with the second access transistor of each of the plurality of memory cells, between second access transistor of each of the plurality of memory cells and the second bit line, and configured to be controlled by the first bit line.

According to a second aspect of the present invention there is provided a method for reading a data value stored in a memory cell of a memory unit comprising a plurality of memory cells in which access to each memory cell is controlled by a combination of both a word line and a pair of bit lines associated with the memory cell. The method comprises
i) driving a voltage on a word line associated with the memory cell high;
ii) using a current source to apply a current to charge the pair of bit lines associated with the memory cell;
iii) removing the current from the pair of bit lines associated with the memory cell; and
iv) sensing a voltage difference between the pair of bit lines associated with the memory cell to determine the data value.

The method may comprise applying the current until one of the pair of bit lines is pulled high. The method may then further comprise using a dummy timing element to determine when one of the pair of bit lines has been pulled high.

The method may further comprise using a reference circuit to simulate the memory cell, determining an average pull-down current of the reference circuit, and limiting the applied current to the average pull-down current of the reference circuit. The reference circuit may be provided by a plurality of dummy memory cells operating in parallel with the memory cell.

The present invention will now be more particularly described by way of example only with reference to the accompanying drawings, in which:

FIG. 9 illustrates example butterfly plots obtained for (a) a conventional read operation and (b) a current-limited read operation;

Figure 5:
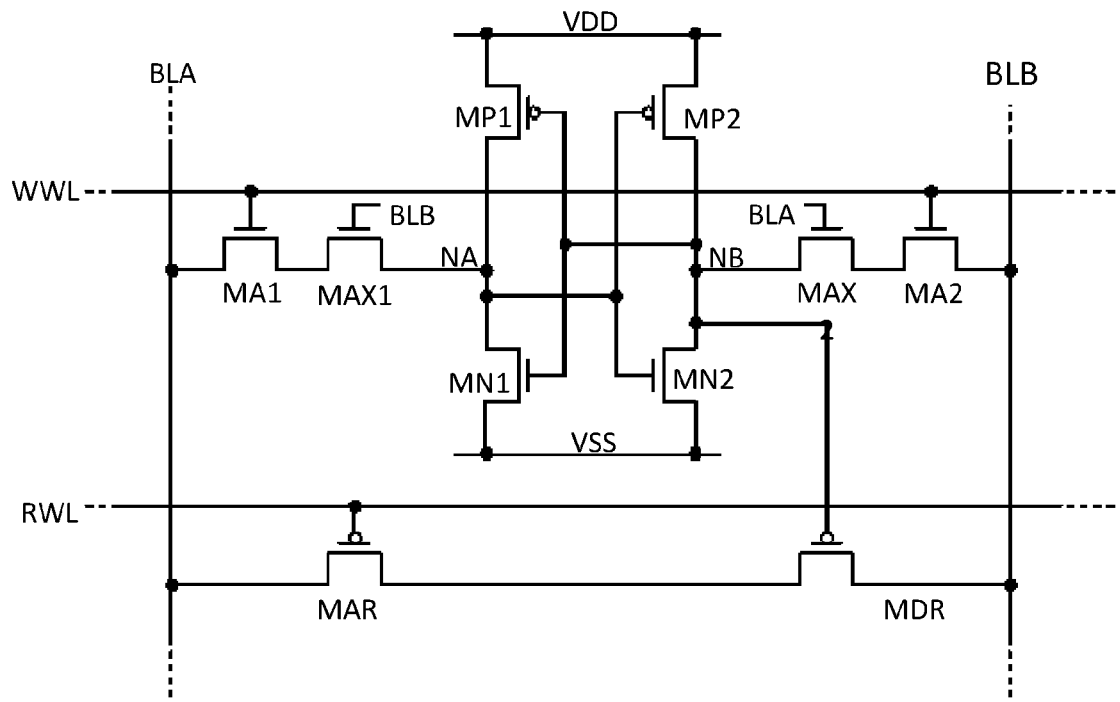
FIG. 5 illustrates an example of a bit line selected write 10-transistor memory cell.
Figure 6:
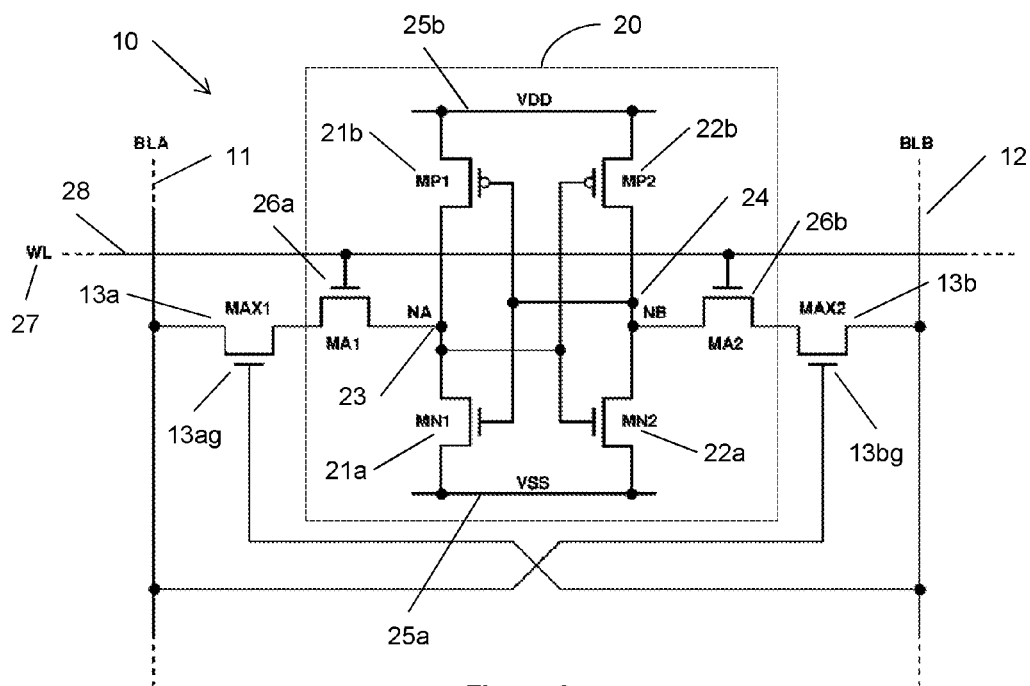
FIG. 6 illustrates an example of an active bit line enabled (ABLE) 8-transistor memory cell.

With reference to FIG. 6, there is shown an embodiment of a memory unit 10 that has similarities to the memory cell design described with reference to FIG. 5, but in which the read path devices MAR and MDR are no longer present, and a single word line (WL) is now employed for both read and write operations. In particular, the arrangement includes a conventional 6-transistor memory cell 20 having a storage element made up of two back-to-back inverters (MN1, MP1 and MN2, MP2) 21a, 21b and 22a, 22b providing respective first and second storage nodes (NA) 23 and (NB) 24, and connected across voltage lines (VSS) 25a and (VDD) 25b. The memory cell 20 also comprises two access transistors (MA1 and MA2) 26a, 26b that are turned ON by means of word line control 27 (shown schematically) connected to read and write word line (WL) 28. The first storage node (NA) 23 of the first inverter (MN1, MP1) 21a, 21b is operatively connected to a first external bit line (BLA) 11 via the first access transistor 26a. The first external bit line (BLA) 11 provides for data transfer to and from the first storage node 23. The second storage node (NB) 24 of the second inverter (MN2, MP2) 22a, 22b is operatively connected to a second external bit line (BLB) 12 via the second access transistor 26b. The second external bit line (BLB) 12 provides for data transfer to and from the second storage node 24.

The memory unit 10 of FIG. 6 also a pair of active bit line enabled (ABLE) devices 13a, 13b. The first active bit line enabled device 13a comprises a includes a BLB controlled access switch connected between the first storage node 23 of the memory cell 20 and the first external bit line (BLA) 11, whilst the second active bit line enabled device 13b comprises a BLA controlled switch connected between the second storage node 24 of the memory cell 20 and the second external bit line (BLB) 12. The BLB controlled switch 13a may comprise a transistor (MAX1) having a gate 13ag wherein the gate 13ag is connected to the first external bit line (BLA) 11. The BLA controlled switch 13b may also comprise a transistor (MAX2) having a gate 13bg connected to the second external bit line (BLB) 12). In FIG. 6, the active bit line enabled (ABLE) devices 13a, 13b are illustrated as being located between the respective bit lines 11, 12 and access transistors 26a, 26b.

This memory unit 10 would be used in an array wherein the default state for all bit lines (BLA and BLB) of unselected columns is to be held at a low voltage thereby turning the active bit line enabled (ABLE) devices/bit line controlled access switches (MAX1 and MAX2) off and disabling access to the memory cells in the unselected columns of the array.

For a write operation to a memory cell 20 within such a memory unit 10, one of the external bit lines BLA 11 and BLB 12 of the associated column is driven high and the other held low, and then the read and write word line (WL) 28 is driven high. The ABLE device connected to the high bit line (i.e. one of MAX1 and MAX2) will turn on thus enabling the pull down path from one of the storage nodes (NA or NB) to the other, low bit line, thereby forcing the cell 20 into the required state. The read and write word line (WL) 28 is then driven low to disconnect the memory cell 20 with its data store held in its new state.

For a read operation, the most straightforward approach is to first charge both of the external bit lines BLA 11 and BLB 12 of the associated column high to enable the ABLE devices (MAX1 and MAX2) 13a and 13b. The drive to the bit lines is then disabled and the read/write word line (WL) 28 driven high. This will then turn on the word line access transistors (MA1 and MA2) 26a, 26b and the read operation will proceed in a conventional manner wherein one or other of the bit lines (depending on the state of the stored data) will be discharged through the cell 20. The difference in voltage between the two bit lines can then be sensed and used to determine the value of the data stored in the cell.

The downside of the arrangement illustrated in FIG. 6, in which the separate read path has been removed when compared with the arrangement FIG. 5, is that, just as in a conventional 6-transistor cell, the memory cell is now unavoidably loaded during a read operation as the bit line discharge current has to be drawn from one or other of the two NMOS pull-down devices (MN1, MN2) acting as the data storage latch. In the read method described above, the memory cell storage nodes (NA and NB) 23, 24 are immediately presented with their maximum load as the word line devices are turned on with the bit lines charged high. This represents the most severe stability challenge situation for data retention and is a well-known problem for SRAM design.

Various techniques are known for addressing this situation, with one common solution being to constrain the voltage applied to the word line during a read cycle (commonly known as "word line under-drive" or WLUD). A problem with WLUD is accurately determining the optimum word line voltage particularly in the presence of cell variability, i.e. if the voltage is too high, data loss might occur, and if the voltage is too low, the word line access devices might fail to turn on properly resulting in a read failure. However, the arrangement of the memory unit described with reference to FIG. 6 provides the opportunity for alternative means of limiting disruption of the cell during read by implementing a "low impact" read operation. In this context "low impact" refers to reducing the load on the internal storage nodes of the cells being read.

Figure 7:
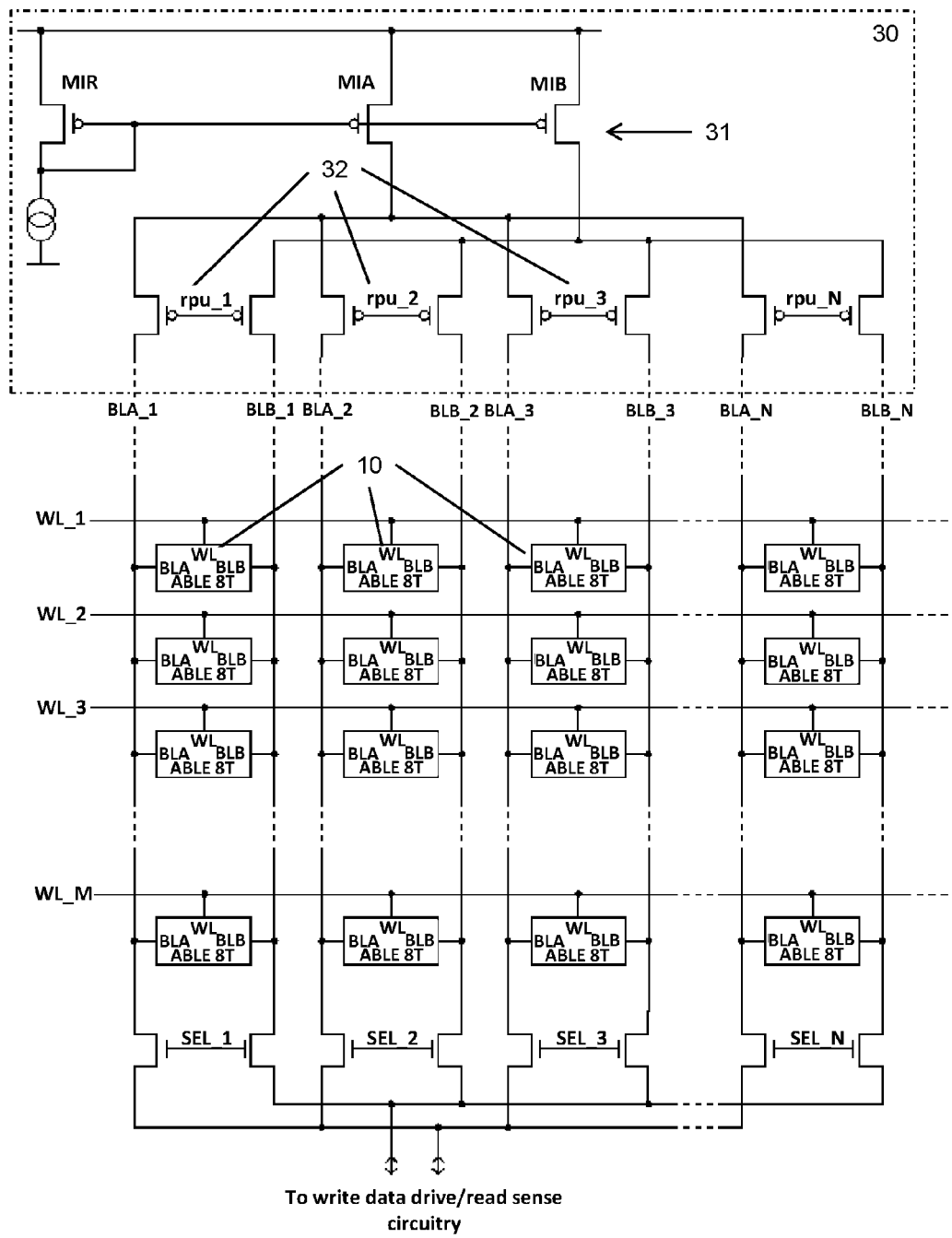
FIG. 7 illustrates an example of a block of ABLE 8-transistor memory cells with read circuitry.

In this regard, FIG. 7 illustrates an embodiment in which a block of a memory is comprised of an array of the memory units 10 illustrated in FIG. 6, such that memory unit 10 effectively acts as an 8-transistor ABLE memory cell, and read circuitry 30. The read circuitry 30 comprises a controlled current source provided by a current mirror 31, which includes PMOS devices MIR, MIA and MIB, and which is switched into the column to be read using read pull-up controls (rpu_1, rpu_2 etc.) applied to the appropriate switch devices 32. The controlled current source thereby provides a read driver for read operations. Preferably, the array would also comprise a voltage source configured to charge one or both of the first bit line and the second bit line of each column, thereby providing a write driver for write operations.

The essence of the low impact read operation is to charge the bit lines gradually with the word line already turned on so that when the active bit line enabled (ABLE) devices within an 8-transistor ABLE memory cell become conductive, the low ("0") storage node of the cell is able to sink the charging current and prevent the voltage rising further. In particular, rather than rapidly driving the bit line voltages high for a read cycle, both bit lines are instead charged using controlled current sources provided by the current mirror (devices MIR and MIA/MIB) which are switched into the column to be read using individual read pull-up controls (i.e. rpu_1, rpu_2 etc).

Figure 8:
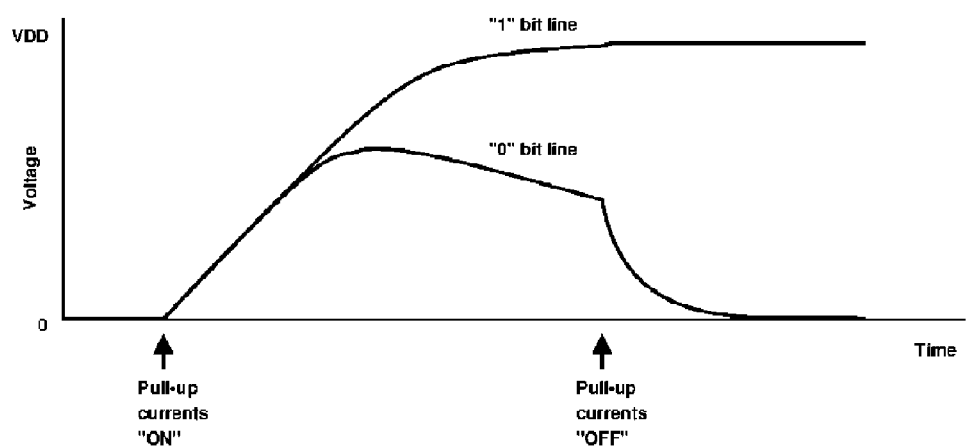
FIG. 8 illustrates an example of bit line wave forms for a current limited read operation.

In more detail, in order to execute a read operation for a selected 8-transistor ABLE memory cell, the voltage on the read and write word line (WL) for the row of the selected memory cell (i.e. one of WL_1, WL_2 etc.) is first driven high. The voltages on all the bit lines are initially low (and on all the unselected columns will stay low throughout the operation thereby isolating all the cells on those columns). The selected column pull-up currents provided by the controlled current source are then applied via the switch devices 32 (controlled by rpu_1 rpu_2 etc.). The application of the charging currents causes the bit line voltages to start to rise, and at first both bit lines rise together. When the voltage levels on the bit lines reach the threshold voltage for the active bit line enabled (ABLE) devices (i.e. NMOS bit line controlled access transistors (MAX1 and MAX2)) associated with the selected memory cell, the selected memory cell will start to draw current on the "0" (low) side of the cell, and the voltage rise on that bit line will abate. As the cell current pull down strength rises (due to the voltage on the "1" (high) bit line continuing to increase) the voltage on the "0" (low) bit line side will start to fall. Once sufficient time has been given for the "1" (high) bit line to reach the positive rail voltage, the charging currents are turned off, and then the bit line voltage on the "0" (low) side will drop to 0V since the cell is no longer loaded by the pull-up currents. FIG. 8 illustrates an example of the bit line waveforms for this current limited read operation.

Preferably, a dummy timing element can be used to determine when one of the bit lines has gone high in order to ensure the process is both time and power efficient. By way of example, a dummy timing element could comprise a known capacitance to which a known charging current is applied in order to emulate the waveform on the bit lines. This dummy timing element would then be monitored in order to provide a timing signal that provides an indication of when the high bit line has reached the positive rail voltage, and that can therefore be used to turn off the charging currents applied to the bit lines. As a further example, a dummy timing element could comprise an exact copy of a column of the block, complete with the relevant number of memory cells, which would be deactivated in some way (e.g. word lines tied low, or pull-downs disconnected), and using an identical current source to that used to implement the read operation for the memory block.

As long as the pull-up currents are less than the maximum current that the cell can pull down, the voltage disruption on the internal cell storage nodes will be reduced compared to that which would have occurred in the conventional read operation. For example, if the cell's maximum pull-down current is 50 µA and a 25 µA charging current is applied, the internal voltage disruption will essentially be halved using the low impact read operation described above when compared with a conventional read operation (i.e. in which the bit lines are driven hard to the positive supply voltage).

The reduction of the voltage disruption on the internal cell node can be regarded as an improvement of cell stability. This is often described by the read static noise margin metric (SNM) derived from the "butterfly" curves obtained by superimposing transfer characteristics of the two loaded inverters of the SRAM cell. This is illustrated in FIG. 9 which shows example effective butterfly plots obtained for 10,000 samples of (a) a conventional read operation and (b) a current-limited, low impact read operation.

One important application for this technique pertains to the potential to reduce the operating voltage of an array or memory cells in order to reduce leakage current. Normally this could seriously compromise cell stability in a conventional SRAM memory array. However by implementing an appropriately current-limited read operation using active bit line enabled access devices as described above, this degradation can be ameliorated and robust read operations maintained.

Using this method of implementing a read operation, the lower the charging current, the less the bit cells are stressed. However, using a very low current would cause a read operation to take a relatively long time. On the other hand, if the pull-up current exceeds the cell pull-down current, the bit line voltage will rise further towards the top supply rail. Therefore, in order to optimise read speed in accordance with the cell performance or operating conditions, it would be preferable to use a dummy reference circuit to simulate the memory cell and thereby derive a measure of average cell current, which could then be used to dynamically adapt the charging current provided by the controlled current source. For example, this dummy reference circuit could be provided by a plurality of dummy memory cells operating in parallel. In this regard, since the cells themselves are potentially quite variable, it would be prudent to use a number of cells in parallel and then scale the result down to get a good measure of the average cell current. In practice, it could also be advantageous to provide some means of adjusting the read current, e.g. lowering the current to cope with weak cells at the expense of read access time.

Figure 10:
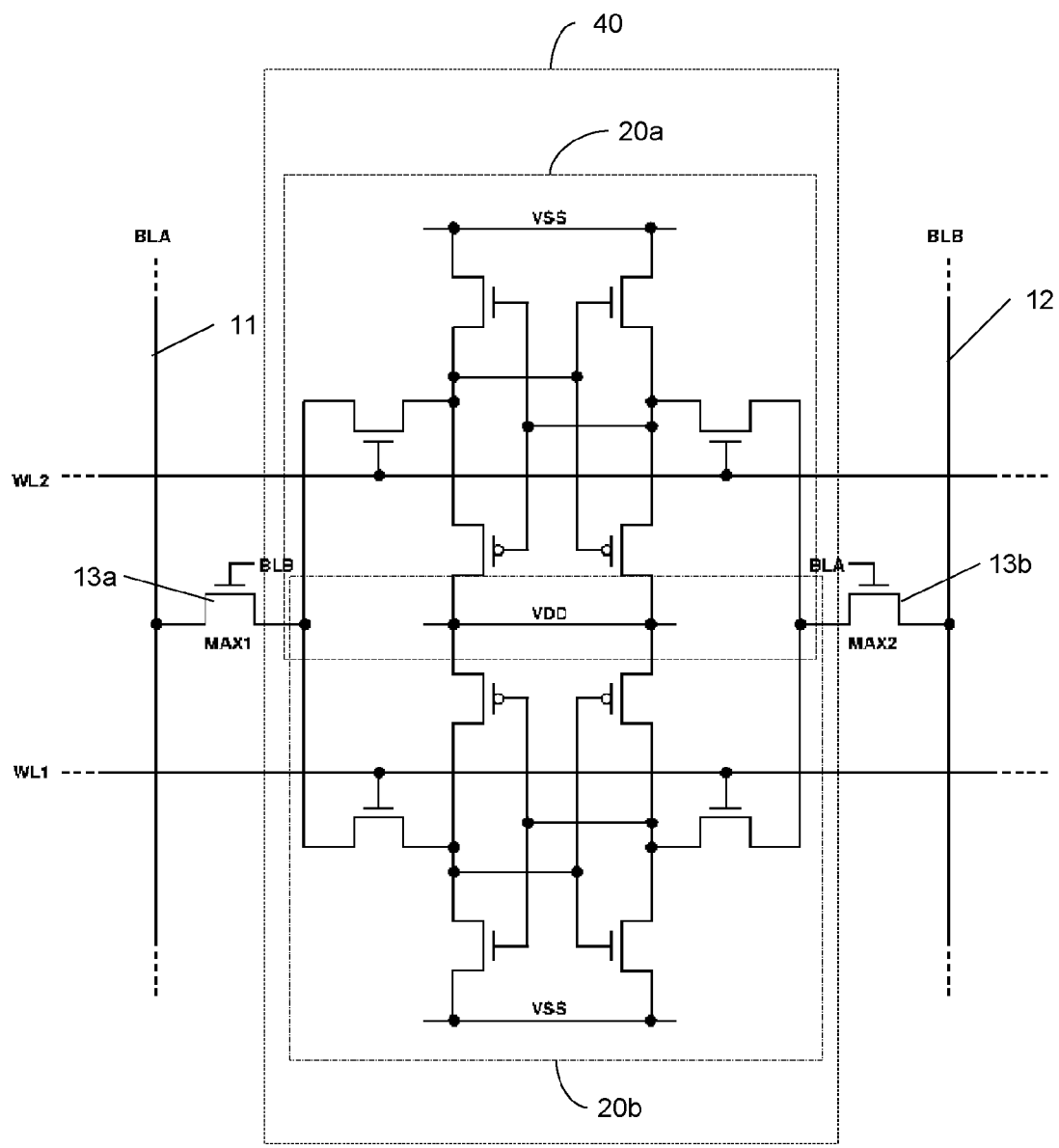
FIG. 10 illustrates an example of a pair of memory cells with shared ABLE devices.
Figure 11:
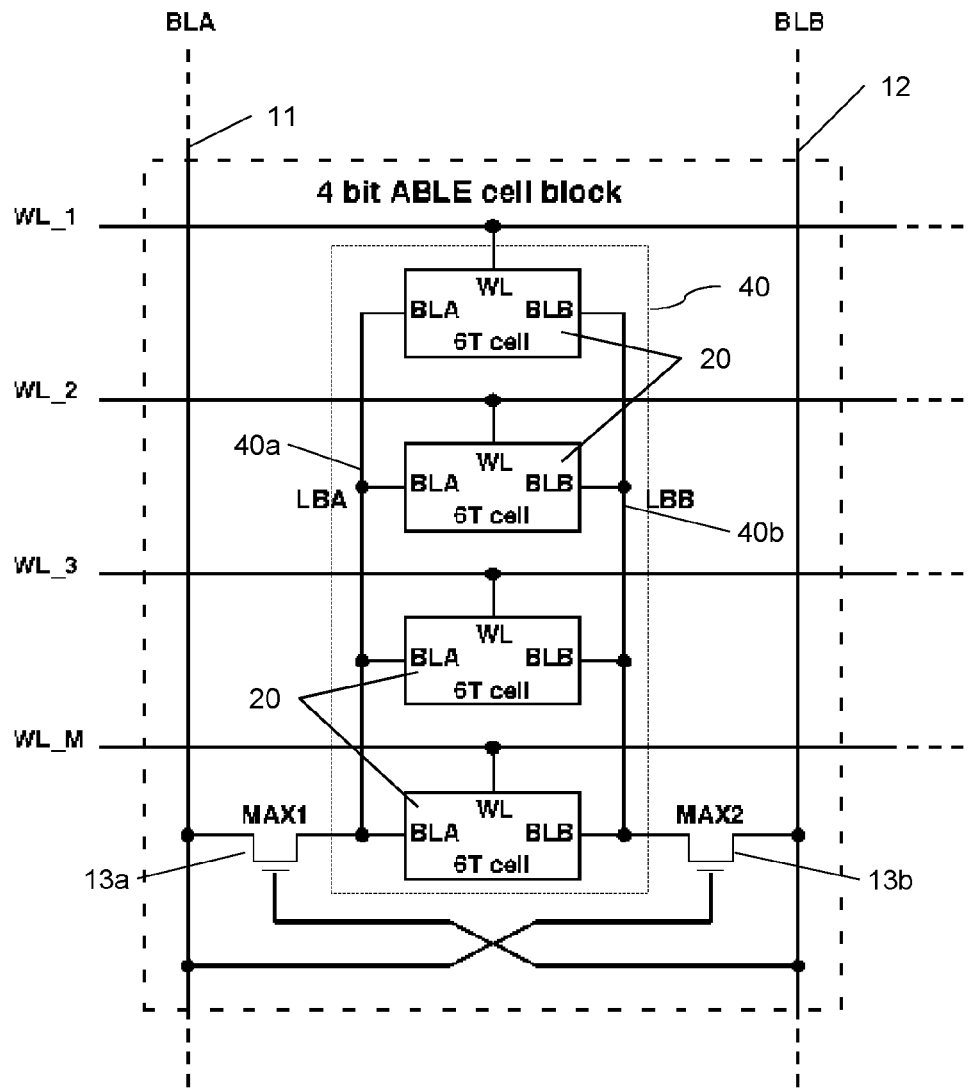
FIG. 11 illustrates an example of a block of four memory cells with shared ABLE devices.

The memory unit 10 described above with reference to FIG. 6 includes two extra devices (i.e. active bit line enabled (ABLE) access devices (MAX1 and MAX2) in comparison to the standard 6-transistor memory cell design. However, in order to alleviate the impact on area (and bit line capacitance), it's possible to share these ABLE access devices between a number of memory cells within the same column. For example, FIG. 10 illustrates an example embodiment in which two ABLE access devices 13a, 13b are shared by two memory cells 20a and 20b. By way of further example, FIG. 11 illustrates an example embodiment in which two ABLE access devices 13a, 13b are shared by a block of four memory cells 20. Conceptually this approach is equivalent to grouping a set of standard 6-transistor memory cells together to form a memory cell group 40 and creating a pair of local bit lines (LBA and LBB) 40a, 40b for the group that are connected to the array/external bit lines (BLA, BLB) 11, 12 via the ABLE access devices 13a, 13b.

Figure 12:
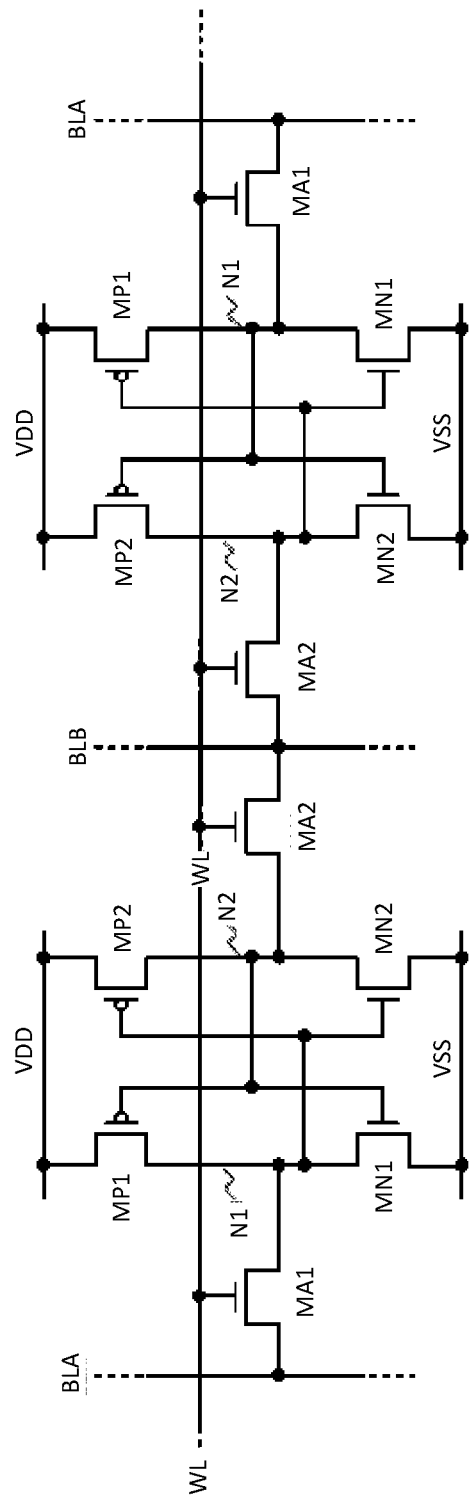
FIG. 12 illustrates an example of a pair of memory cells that share a bit line connection.

The number of memory cells that can be connected together in this way will be limited by capacitance effects. In particular, the larger the capacitance on the local bit lines (LBA and LBB) 40a, 40b, the larger the charge that can be stored on those local bit lines, and the greater the potential for cell disruption when the word line controlled access devices are turned on. In practice, the present inventors have determined that it is advantageous to share the active bit line enabled (ABLE) access devices between odd numbers of a plurality of memory cells. This is because in modern SRAM layouts of standard 6-transistor memory cells the bit line connections are presented on opposite sides of the cell and each bit line connection/contact is shared with neighbouring memory cells that are flipped in their orientation, an example of which is illustrated in FIG. 12.

Figure 13:
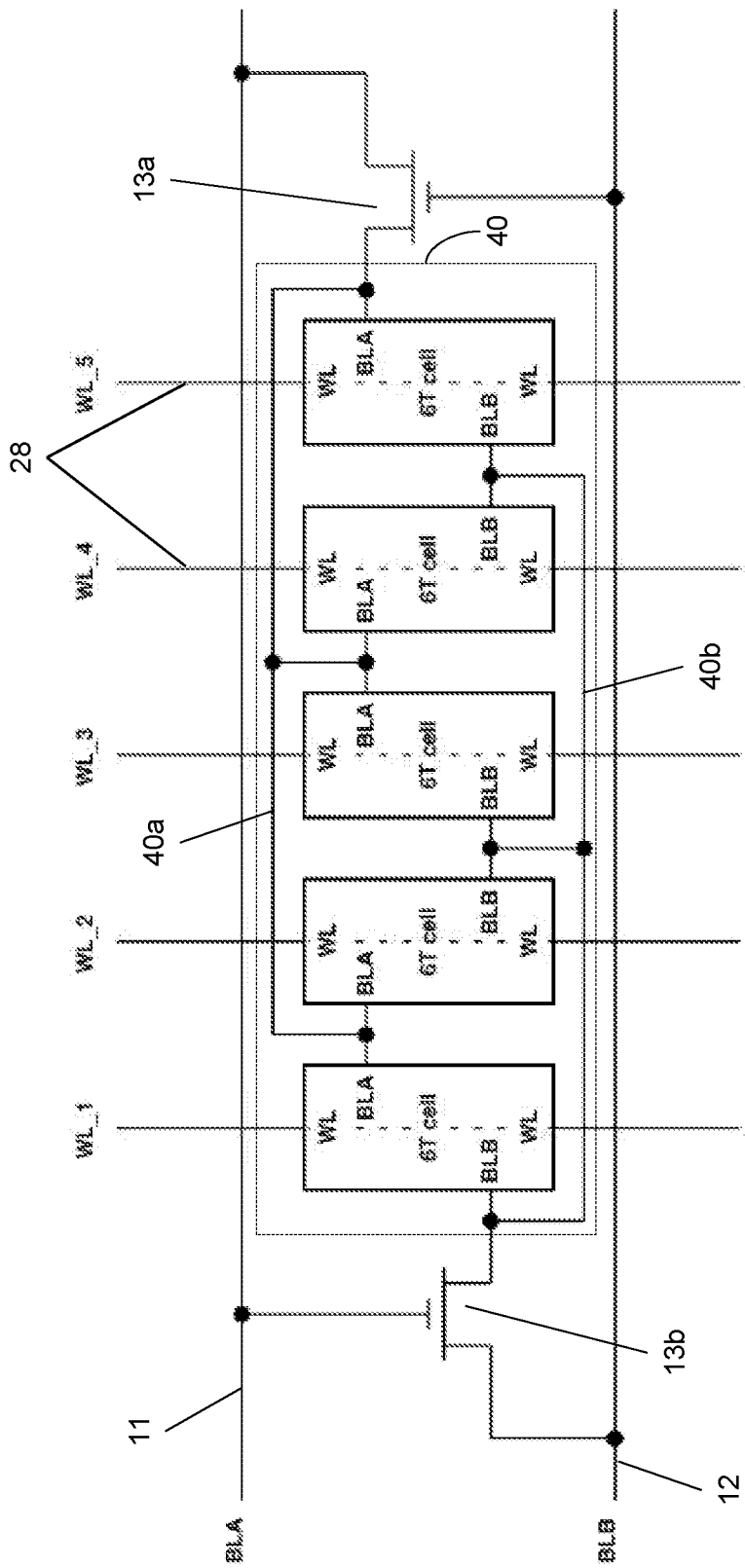
FIG. 13 illustrates an example of a group of a plural odd number of memory cells with shared ABLE devices.

With an even number of memory cells, the approach of using memory cells in alternating orientations prevents one of the bit line connections from being available at the assembly edge. This is not a problem for an array that consists of conventional 6-transistor memory cells without ABLE devices, as every cell is individually connected to each of the bit lines. In contrast, when an array is comprised of groups/segments of a plurality of 6-transistor memory cells that each share a single pair of ABLE access devices, each group/segment has only single connection to each of the bit lines. Consequently, sharing the ABLE access devices between odd numbers of memory cells that have alternating orientations ensures that a first bit line connection (i.e. for connection to a first of the pair of bit lines (e.g. BLA)) is available at a first edge of the memory cell group and a second bit line connection (i.e. for connection to a second of the pair of bit lines (e.g. BLB)) is available at a second edge of the memory cell group. FIG. 13 illustrates schematically the layout of a five 6-transistor segment/group 40 sharing ABLE access devices.

In FIG. 13, the ABLE access devices 13a, 13b are shared by the block/segment/group 40 of five 6-transistor memory cells 20, and the memory cells 20 in the group therefore share a pair of local bit lines (LBA and LBB) 40a, 40b that are connected to the array/external bit lines via the ABLE access devices 13a, 13b.

One problem that arises from using an odd number of memory cells in a block/segment/group 4 is that this is rather cumbersome for the implementation of memory which naturally follows powers of two (which are never divisible by plural odd numbers). To overcome this problem, it is proposed herein to collate two memory cell groups/segments that each comprise a plural odd number of 6-transistor memory cells sharing a pair ABLE access devices such that they are disposed immediately adjacent to one another within a column (i.e. both groups being connected to the same pair of external/column bit lines), thereby forming an aggregate group/segment comprising an even number of 6-transistor memory cells with two pairs of ABLE access devices within the aggregate group. For example, an aggregate group/segment could comprise two groups/segments of three 6-transistor memory cells that share a pair of ABLE access devices, thereby forming an aggregate group of six 6-transistor memory cells having two pairs of ABLE access devices between them. As a further example, an aggregate group/segment could comprise a first group/segment of three 6-transistor memory cells that share a pair ABLE access devices and a second group/segment of seven 6-transistor memory cells that share a pair ABLE access devices, thereby forming an aggregate group of ten 6-transistor memory cells having two pairs of ABLE access devices between them.

In a particular embodiment, a memory array includes an aggregate group/segment comprising a first group/segment of three 6-transistor memory cells that share a pair ABLE access devices and a second group/segment of five 6-transistor memory cells that share a pair ABLE access devices, thereby forming an aggregate group of eight 6-transistor memory cells having two pairs of ABLE access devices between them (i.e. averaging a pair of ABLE devices for every four 6-transistor memory cells). This embodiment is advantageous as it forms an aggregate group of eight 6-transistor memory cells that is far more amenable as the building block of an SRAM memory unit, as it can be conveniently replicated to provide 64 bits, 128 bits, etc. Whilst it would be possible to provide a 128-bit chunk using an aggregation of 25 groups/segments of five 6-transistor memory cells (i.e. five bits) and a single group/segment of three 6-transistor memory cells (i.e. 3 bits), such an arrangement would complicate the connection of the memory cells to both the row decoder and the word line driver. In contrast, by providing an aggregate group made up of a five memory cell group and a three memory cell group it is much more straightforward to provide word line drivers for each block of four memory cells with a space to match the average cell pitch. An example of such an arrangement is illustrated in FIG. 14.

Figure 14:
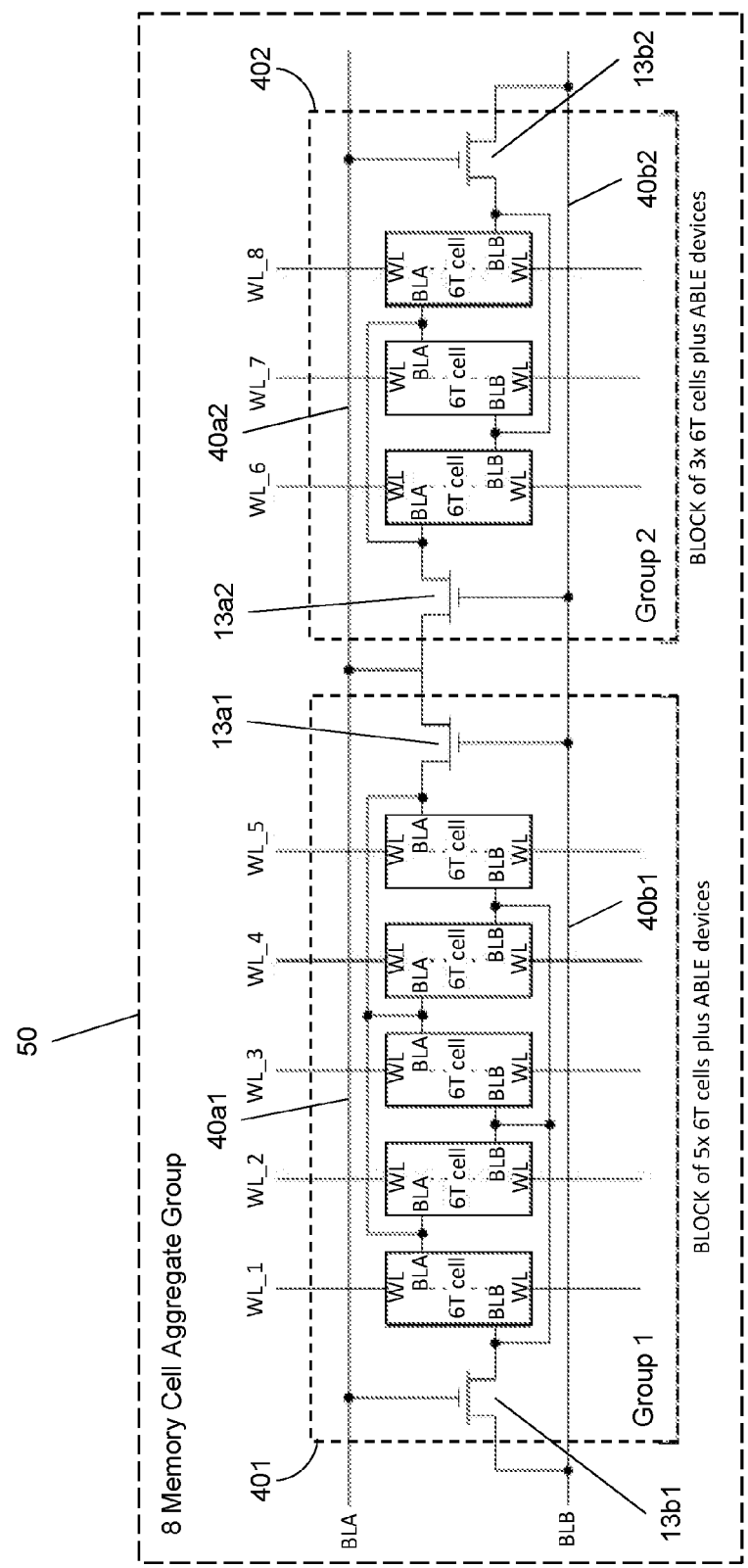
FIG. 14 illustrates an example of an aggregate group of memory cells.

In FIG. 14, the first group (Group 1) 401 comprises five memory cells that share a first pair of ABLE access devices 13a1, 13b1 and a pair of local bit lines (LBA and LBB) 40a1, 40b1 that are connected to the array bit lines via the first pair of ABLE access devices 13a1, 13b1. The second group (Group 2) 402 then comprises three memory cells that share a second pair of ABLE access devices 13a2, 13b2 and a pair of local bit lines (LBA and LBB) 40a2, 40b2 that are connected to the array bit lines via the second pair of ABLE access devices 13a2, 13b2. The first group (Group 1) and the second group (Group 2) therefore form an aggregate group 50 of eight memory cells and two pairs of ABLE access devices.

Figure 3:
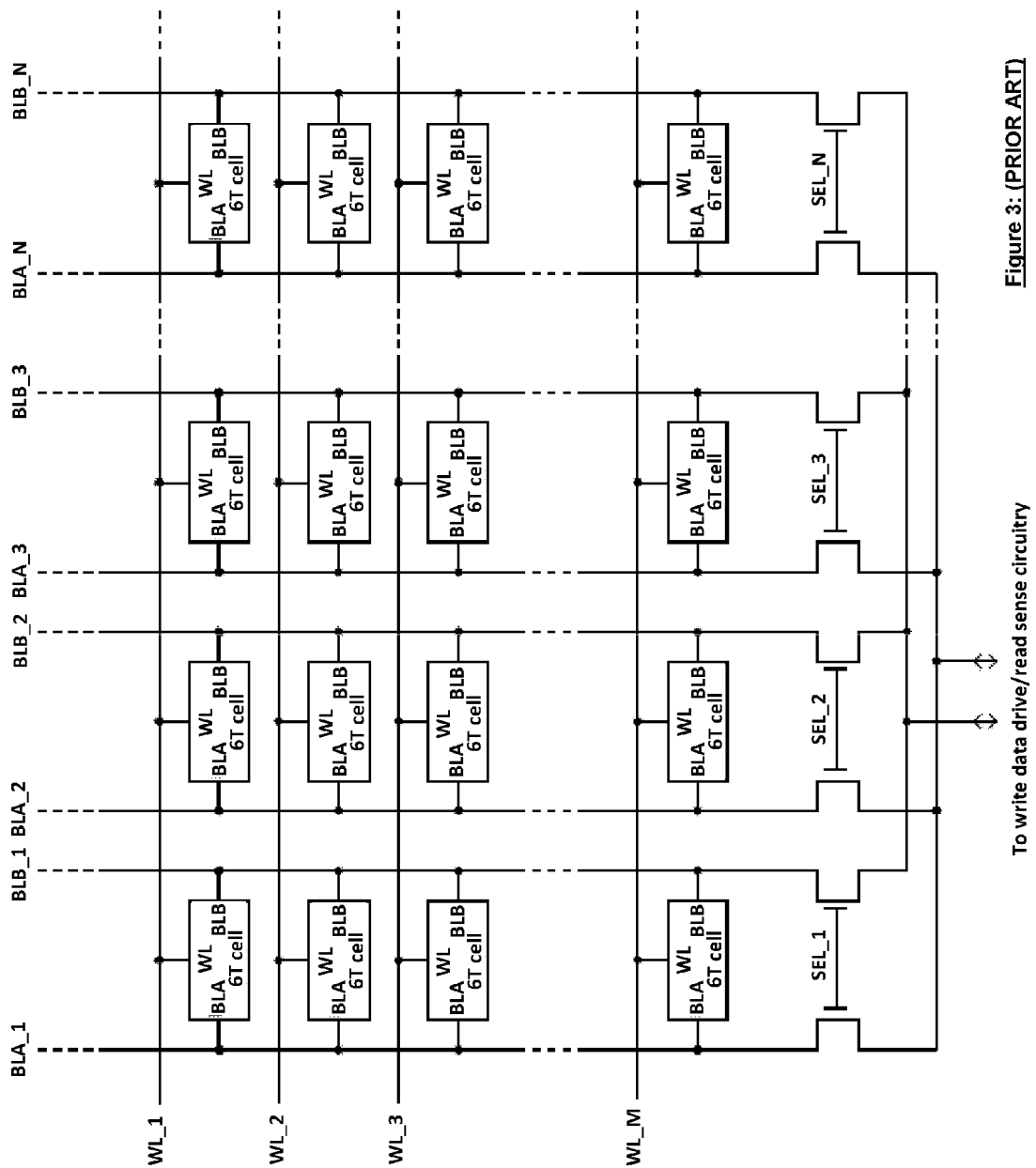
FIG. 3 illustrates an example of a block of 6-transistor memory cells of the prior art.
Figure 4:
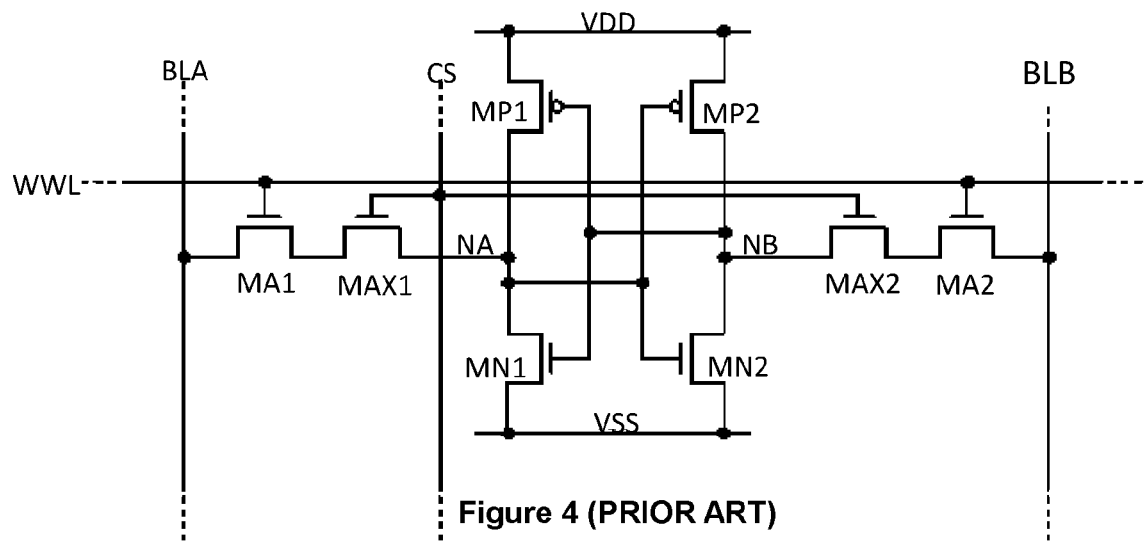
FIG. 4 illustrates an example of a memory cell with column select lines of the prior art.

In a conventional SRAM memory unit it is usually necessary to multiplex the bit lines from a number of columns (usually 4, 8 or 16) in an array of memory cells into a single sense amplifier as the latter is generally larger than the width of one column and therefore has to be shared. This multiplexing is generally implemented using pairs of NMOS transistors (as illustrated at the bottom of FIG. 3 and FIG. 7) that are controlled by column select signals (sel_1, sel_2 etc.) to connect the bit lines from a number of columns into the sense amplifier inputs.

When implementing an SRAM memory unit that makes use of active bit line enabled (ABLE) access devices as described above it has been recognised herein that this multiplexing can be rationalised. In this regard, as described above, when implementing a read operation, the bit lines associated with the cell to be read are charged, which acts to select the column as active. Consequently, each column can be provided with its own differential input pair, with the differential input pairs being connected in parallel for each of the columns attached to the sense amplifier. In other words, each pair of bit lines directly drive the gates of two transistors of a differential pair (also known as a long-tailed pair, which is a standard configuration in which the sources of two transistors are tied together but the drains are separate) which provide the inputs to the sense amplifier.

By providing each column with its own differential pair, only the column whose bit lines have been activated as part of the read operation will participate in the data sensing operation, as only that column will have bit line voltages at a level sufficient to turn on the transistors of the associated differential input pair. Effectively the bit line pair selection is performed by the act of charging just one pair of bit lines, such that there is no need to provide any additional selection mechanism (i.e. multiplexing) at the inputs to the sense amplifier. An example of such an arrangement is illustrated in FIG. 15.

Figure 15:
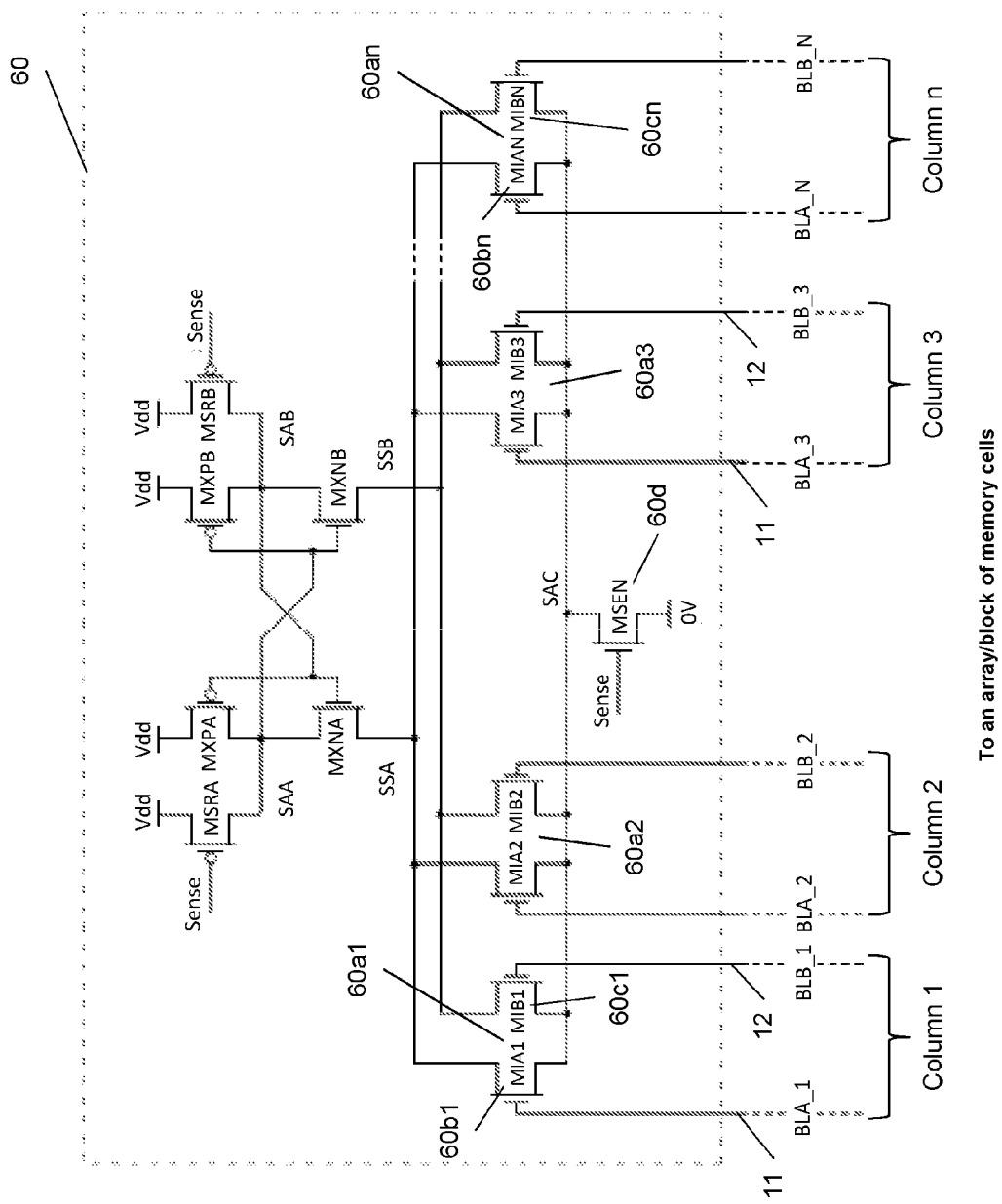
FIG. 15 illustrates an example of a sense amplifier suitable for use with an array/block of memory cells that makes use of ABLE access devices.

As illustrated in FIG. 15, all of the bit line pairs have their own differential pair, which are wired in parallel, and only one pair will participate in the data sense operation as all the others will be turned off as the associated bit lines are still low (e.g. at 0V). This arrangement therefore takes advantage of the different voltage levels of the active bit lines to effectively select one differential pair. Then, for whichever of the active bit lines (BLA/BLB) is pulled high, either SAA or SAB will then be pulled low (i.e. connected to 0V) during the sense operation (i.e. when the "sense" input is high), such that the values of SAA and SAB are the inverse of the values on BLA and BLB.

In more detail, FIG. 15 illustrates an arrangement in which a sense amplifier 60 is operatively connected to an array/block of memory cells (not shown). The sense amplifier 60 comprises a plurality of differential input pairs 60a1, 60a2, 60a3, 60an, each of which connect the sense amplifier 60 to a pair of column (external) bit lines 11, 12. In this regard, each pair of column bit lines comprises a first column bit line 11 and a second column bit line 12 that extend the length/height of the associated column and that are operatively connected to each of the memory cells in the associated column. In this regard, a memory cell within a column of the array/block could be individually connected to the first and second column bit lines of that column (i.e. via respective ABLE access devices). Alternatively, a plurality of memory cells in a column of the array/block could be grouped into a memory cell group/segment, such that each of the memory cells in the group are individually connected to a pair of local bit lines with the local bit lines then being connected to first and second column bit lines of that column (i.e. via respective ABLE access devices).

Each differential input pair comprises a first input transistor 60b1-60bn and a second input transistor 60c1-60cn, and in the illustrated example both the first input transistor and the second input transistor are provided by NMOS transistors (MIA1-n, MIB1-n). The first column bit line (BLA) 11 of each column is configured to control the first input transistor 60b1-60bn of the associated differential input pair by driving the gate terminal of the first input transistor 60b1-60bn, whilst the second column bit line (BLB) 12 of each column is configured to control the second input transistor 60c1-60cn by driving the gate terminal of the second input transistor. The source terminals of both the first input transistor 60b1-60bn and the second input transistor 60c1-60cn of each differential input pair are operatively connected to ground via a sense activation switch 60d of the sense amplifier 60, provided in the illustrated example by an NMOS transistor (MSEN), which is activated by a "sense" signal.

As part of a read operation, only one pair of column bit lines will be high (i.e. the column bit lines associated with the memory cell to be read will be charged), which acts to select the column as active. Consequently, only the differential input pair associated with that column will be active. When the "sense" signal input is low, such that the sense activation switch is off, both the sensing nodes (SAA and SAB) of the sense amplifier 60 will be high. When the "sense" signal is driven high, such that the sense activation switch 60d is turned on, one of the sensing nodes (either SAA or SAB) of the sense amplifier 60 will be pulled low depending on voltage difference on the first and second input transistors, which will in turn depend on voltages on the first column bit line and second column bit line respectively.

The main advantage of this capability is realised when incorporated into a hierarchical bit line implementation. In this regard, it is common practice to split large memories in particular into a number of smaller units in order to minimise bit line capacitance so as to achieve good speed performance and save power. This naturally creates a hierarchy in the structure of the data signal paths from the I/O pins to the storage bits. An example of a hierarchical bit line implementation is shown in FIG. 16.

Figure 16:
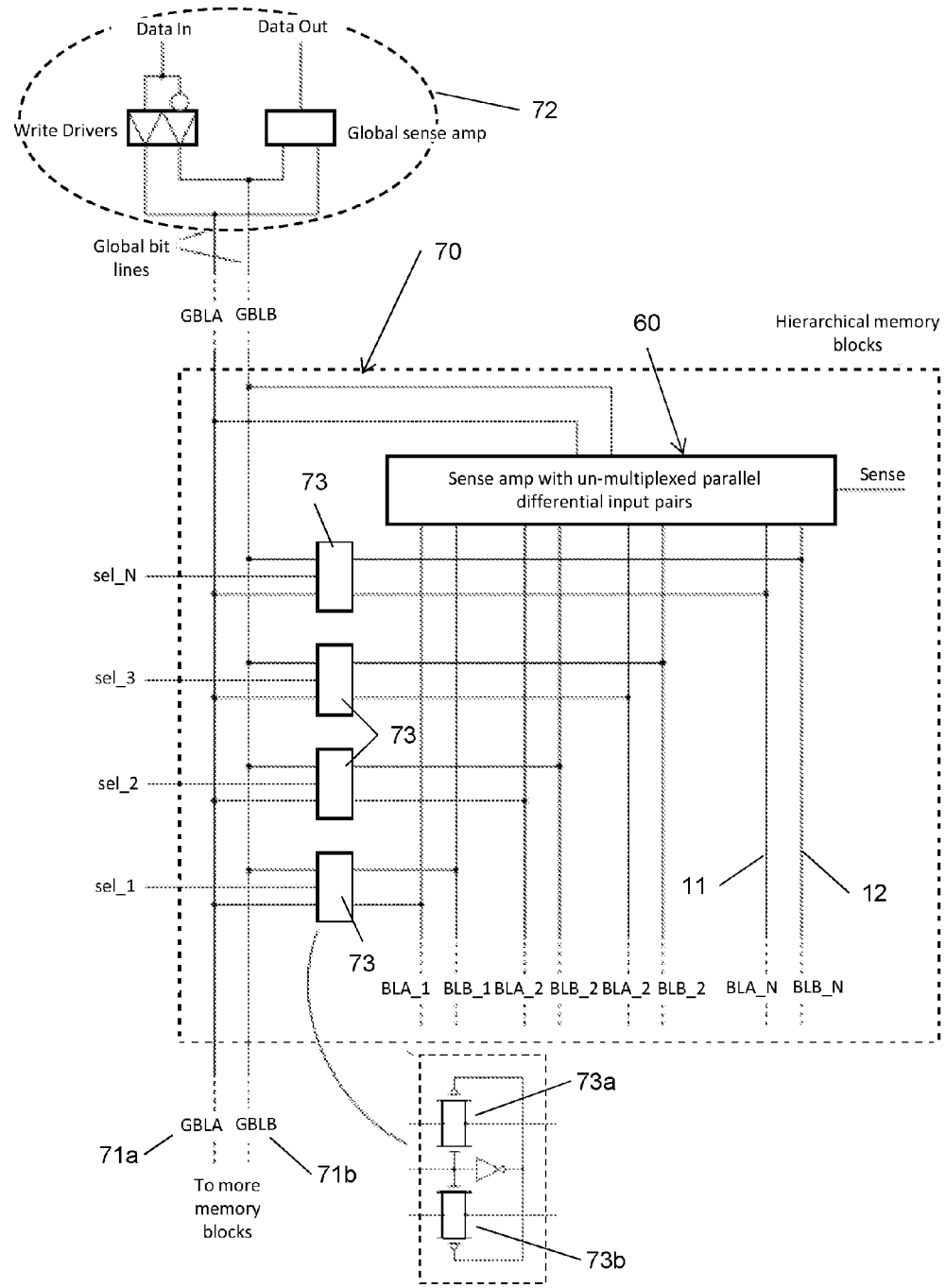
FIG. 16 illustrates an example of a memory unit having a hierarchical bit line arrangement suitable for use with an array/block of memory cells that makes use of ABLE access devices.

In the architecture illustrated in FIG. 16, a memory array is split into a repeated number of blocks 70, only one of which is shown in FIG. 16 for simplicity. A pair of global bit lines 71a, 71b (GBLA and GBLB) connects between the data input/output circuitry 72 and each of the memory blocks. The connection between global bit lines 71a, 71b and the required column in the required block is achieved via pairs of switches 73a, 73b (i.e. one switch for each bit line within a column), and only one pair is ever enabled at any one time. These multiplexing switches 73 comprise a pair of full transmission gates 73a, 73b (both an NMOS transistor and a PMOS transistor in parallel) since they need to be able to actively drive both high and low to the bit cell arrays during a write operation. In this regard, when using MOS devices as "pass transistors" NMOS devices only pull low well, whilst PMOS devices only pull high well. This is due to threshold voltages causing the channels to turn off when the signal levels are not conducive to conduction. Therefore, when it is necessary to drive both high and low signals through a switch, a transmission gate comprised of both an NMOS transistor and a PMOS transistor in parallel is used.

The memory array illustrated in FIG. 16 differs from a conventional hierarchical bit line memory cell array in that a conventional hierarchical bit line memory cell array would require additional multiplexing switches to connect the column bit lines 11, 12 in the memory block to a single shared sense amplifier 60. In this regard, since the multiplexing switches 73 are used to connect the column bit lines to the global bit lines 71, and the sense amplifier 60 needs to drive its output back onto the global bit lines 71, the same multiplexing switches 73 cannot also be used for selecting which column bit lines are connected into the associated sense amplifier 60. Therefore, in a conventional hierarchical bit line memory cell array, duplicate multiplexing switches would be needed to share the one block sense amplifier between all the columns. However, in the arrangement illustrated in FIG. 16, no further multiplexing switches are required to connect the bit lines to the sense amplifier 16, as the sense amplifier 16 includes a differential pair that connects the bit lines of each column to the sense circuitry, as described above with reference to FIG. 15.

Whilst operation within a memory block that makes use of ABLE access devices requires use of bit lines which by default are pre-charged low, the present inventors have recognised that in this arrangement it is preferable that the global bit lines are pre-charged high by default. The reason for this is that the multiplexing switches used to drive (complementary) data into the array for a write operation also provide the most convenient means to charge up the appropriate bit line pair as the precursor to the read operation. In other words, by pre-charging the global bit lines high by default, the global bit lines can then be used to charge the bit lines within the array prior to a read operation just by turning on the required transmission gate that also constitutes the write path. This is most efficiently achieved if the global bit lines are already at a high voltage, which is contradictory to standard practice in which the global and block bit lines operate with similar pre-charge levels. The sense amplifier is then only activated after the global bit lines have been disconnected from the column bit lines and the voltages on the column bit lines have had time to diverge. In addition, any active drive onto the global bit lines also has to be disabled in order to prevent any conflict when the sense amplifier starts to drive its output back to the data input/output circuitry. However, it should be noted that the pre-charging devices and controls are not shown in FIG. 16 for simplicity.

Figure 1:
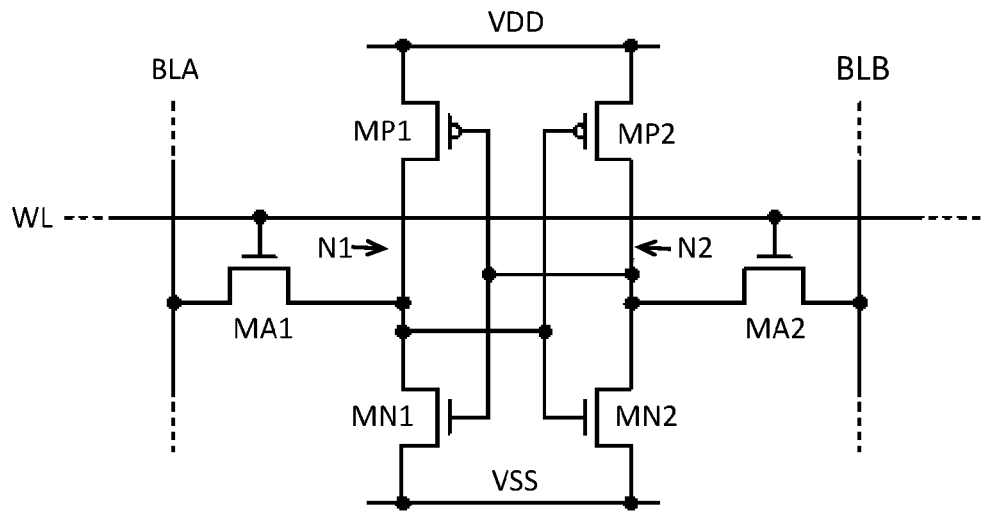
FIG. 1 illustrates an example of a standard 6-transistor memory cell of the prior art.
Figure 2:
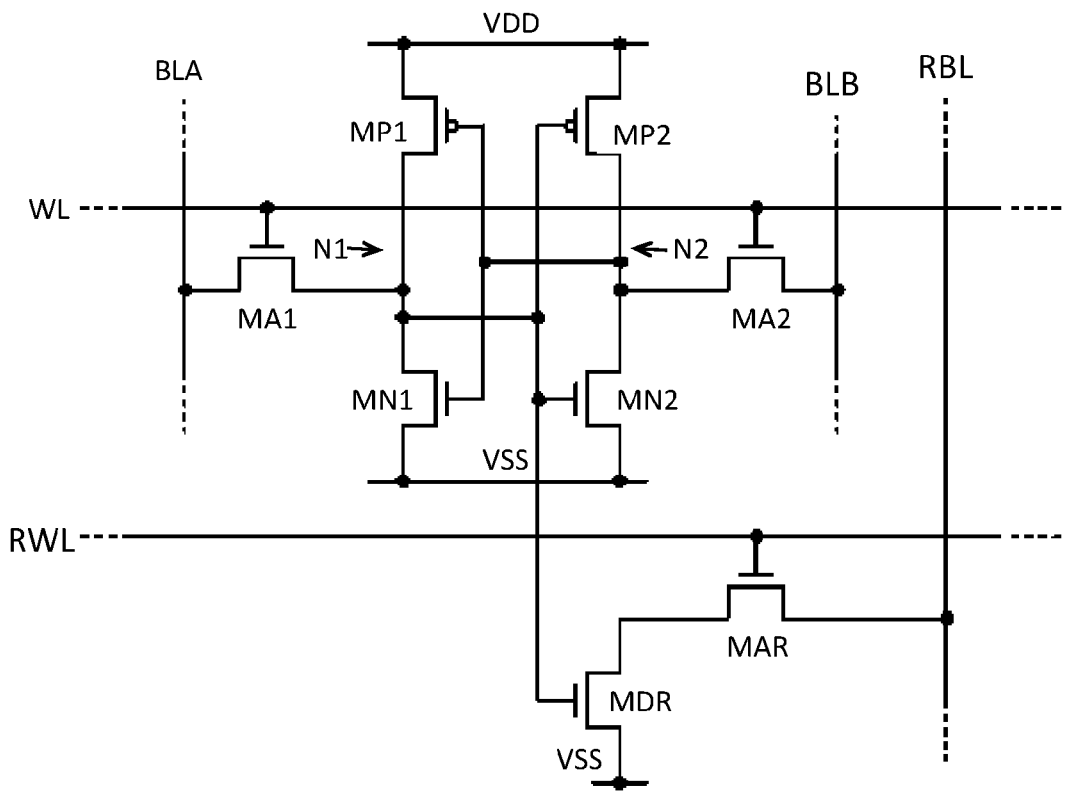
FIG. 2 illustrates an example of an 8-transistor memory cell with buffered operation of the prior art.

In addition, it has been recognised herein that a further advantage of implementing an SRAM memory unit that makes use of active bit line enabled (ABLE) access devices as described above is that it allows for alternative methods of operating the word lines associated with the memory cells. In this regard, in a conventional array of memory cells, asserting any one of the word lines will activate the access devices (e.g. MA1 and MA2 of FIG. 1) that connect all of the memory cells in the row to their associated bit line, and it is therefore essential to turn the active word line off again at the end of a read/write operation.

When making use of active bit line enabled (ABLE) access devices, activity of the memory cells in an array is controlled by a combination of both word line and bit lines associated with a memory cell, thereby providing greater flexibility in word line behaviour. For example, when making use of active bit line enabled (ABLE) access devices it is no longer necessary to ensure the word lines are turned off after an access, which can give further power savings. In this example, if the user is making successive accesses to the same row (i.e. to memory cells in the same row of the array that are therefore associated with the same word line), the word line can be kept high continuously, thus saving the power required to switch the word line off and on for each cycle.

By way of further example, this behaviour may also be advantageous for implementing "late writes". A late write is a desirable feature for some cache applications where the data to be written is not determined until relatively late in the write operation, such that the address decode (i.e. the identification of the memory cell) is completed before the data to be written is determined. In a conventional array of memory cells turning on the word line too early would cost wasted power so some sort of delayed word line gating would be needed. In contrast, when making use of active bit line enabled (ABLE) access devices, the word line can be asserted as soon as the address decode is complete without incurring any power penalty as no activity will take place until data is driven onto the bit lines.

It will be appreciated that individual items described above may be used on their own or in combination with other items shown in the drawings or described in the description and that items mentioned in the same passage as each other or the same drawing as each other need not be used in combination with each other. In addition, the expression "means" may be replaced by actuator or system or device as may be desirable. In addition, any reference to "comprising" or "consisting" is not intended to be limiting in any way whatsoever and the reader should interpret the description and claims accordingly. Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, those skilled in the art will appreciate that the above-described invention might be equally applicable to other types of memory.

The invention claimed is:

1. A memory unit comprising:
   a) a plurality of memory cell groups, each memory cell group comprising a plurality of memory cells that are each operatively connected to a first local bit line and a second local bit line by respective first and second access transistors, and each memory cell being associated with a word line configured to control the first and second access transistors of the memory cell;
   b) the first and second local bit lines of each memory cell group being operatively connected to respective first and second column bit lines by respective first and second group access switches, the first group access switch being configured to be controlled by the second column bit line and the second group access switch being configured to be controlled by the first column bit line, in which the first and second group access switches comprise Active Bit Line Enabled NMOS devices having a low voltage off state and a high voltage on state, and wherein the first and second access transistors comprise the NMOS devices.

2. The memory unit of claim 1, wherein each memory cell group comprises odd numbers of the memory cells.

3. The memory unit of claim 1, wherein the memory unit comprises a first memory cell group that includes five memory cells and an adjacent second memory cell group that includes three memory cells.

4. The memory unit of claim 1, wherein the memory cell groups are configured into pairs of adjacent memory cell groups, each pair comprising a first memory cell group that includes five memory cells and a second memory cell group that includes three memory cells.

5. The memory unit of claim 1, wherein each memory cell comprises a pair of cross-coupled inverters having respective first and second storage access nodes, the first access transistor being operatively connected to the first storage access node, and the second access transistor being operatively connected to the second storage access node.

6. The memory unit of claim 1, wherein, for each memory cell group, the first local bit line is operatively connected to a first storage access node of each memory cell in the memory cell group via the first access transistor of the respective memory cell, and the second local bit line is operatively connected to a second storage access node of each memory cell in the memory cell group via the second access transistor of the respective memory cell.

7. The memory unit of claim 1, wherein the word line associated with the memory cell is connected to a gate on the first access transistor of the memory cell and a gate on the second access transistor of the memory cell.

8. The memory unit of claim 1, wherein, for each memory cell group, the first group access switch is connected between the first local bit line and the first column bit line and is configured to be controlled by the second column bit line, and the second group access switch is connected between the second local bit line and the second column bit line and is configured to be controlled by the first column bit line.

9. The memory unit of claim 1, and further comprising a sense amplifier comprising a differential input pair, the differential input pair being configured to be controlled by the first column bit line and the second column bit line.

10. The memory unit of claim 1, further comprising a sense amplifier comprising a differential input pair, the differential input pair being configured to be controlled by the first column bit line and the second column bit line, wherein the differential input pair comprises first and second input transistors, the first column bit line being configured to control the first input transistor and the second column bit line being configured to control the second input transistor.

11. The memory unit of claim 1, wherein the memory unit comprises a plurality of columns, each column comprising the first column bit line and the second column bit line, and each of the plurality of memory cell groups is disposed within one of the plurality of columns.

12. The memory unit of claim 1, wherein each memory cell comprises a single word line.

13. The memory unit of claim 1, wherein, for each memory cell group, the first group access switch comprises a transistor having a gate connected to the second column bit line.

14. The memory unit of claim 1, wherein, for each memory cell group, the second group access switch comprises a transistor having a gate connected to the first column bit line.

15. The memory unit of claim 1, and further comprising a controlled current source configured to charge one or both of the first column bit line and the second column bit line.

16. The memory unit of claim 1, further comprising a controlled current source configured to charge one or both of the first column bit line and the second column bit line, wherein the controlled current source comprises a current mirror.

17. The memory unit of claim 1, and further comprising a dummy timing element configured to provide an indication as to when one of the first column bit line and the second column bit line has been pulled high.

18. The memory unit of claim 1, further comprising a dummy timing element configured to provide an indication as to when one of the first column bit line and the second column bit line has been pulled high, wherein the dummy timing element comprises a capacitance device and a controlled current source configured to apply a charging current to the capacitance device.

19. The memory unit as claimed in claim 1, and further comprising a voltage source configured to charge one or both of the first column bit line and the second column bit line.

20. A method for reading a data value stored in the memory cell of the memory unit as claimed in claim 1, wherein access to each memory cell is controlled by a combination of the word line and a pair of the first and second local bit lines associated with the memory cell, the method comprising:
   i) driving a voltage on the word line associated with the memory cell high;
   ii) applying a current to charge the pair of the first and second local bit lines associated with the memory cell;
   iii) removing the current from the pair of the first and second local bit lines associated with the memory cell; and
   iv) sensing a voltage difference between the pair of the first and second local bit lines associated with the memory cell to determine the data value.

21. The method of claim 20, wherein the current is applied until one of the first and second local bit lines is pulled high.

22. A method for reading a data value stored in the memory cell of the memory unit as claimed in claim 17, wherein access to each memory cell is controlled by a combination of the word line and a pair of the first and second local bit lines associated with the memory cell, the method comprising:

i) driving a voltage on the word line associated with the memory cell high;

ii) applying a current to charge the pair of the first and second local bit lines associated with the memory cell;

iii) removing the current from the pair of the first and second local bit lines associated with the memory cell; and iv) sensing a voltage difference between the pair of the first and second local bit lines associated with the memory cell to determine the data value;

v) using the dummy timing element to determine when one of the first and second local bit lines has been pulled high.

23. The method of claim 20, and further comprising using a reference circuit to simulate the memory cell, determining an average pull-down current of the reference circuit, and limiting the applied current to the average pull-down current of the reference circuit.

24. The method of claim 20, and further comprising using a reference circuit to simulate the memory cell, determining an average pull-down current of the reference circuit, and limiting the applied current to the average pull-down current of the reference circuit, wherein the reference circuit is provided by a plurality of dummy memory cells operating in parallel.

\* \* \* \* \*